United States Patent
Burnett et al.

(10) Patent No.: US 7,733,711 B2
(45) Date of Patent: Jun. 8, 2010

(54) CIRCUIT AND METHOD FOR OPTIMIZING MEMORY SENSE AMPLIFIER TIMING

(75) Inventors: James D. Burnett, Austin, TX (US); Alexander B. Hoefler, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 81 days.

(21) Appl. No.: 12/206,332

(22) Filed: Sep. 8, 2008

(65) Prior Publication Data

US 2010/0061162 A1 Mar. 11, 2010

(51) Int. Cl.
*G11C 16/04* (2006.01)
(52) U.S. Cl. .......................... 365/189.09; 365/230.06; 365/194; 365/205
(58) Field of Classification Search ............ 365/189.09, 365/230.06, 194, 205, 207, 210.1
See application file for complete search history.

(56) References Cited

U.S. PATENT DOCUMENTS 7,307,896 B2 * 12/2007 Doyle et al. ........... 365/189.09

OTHER PUBLICATIONS

Amrutur, Bharadwaj S. et al.; "A Replica Technique for Wordline and Sense Control in Low-Power SRAM's"; IEEE Journal of Solid-State Ciruits; Aug. 1998: pp. 1208-1219; vol. 33, No. 8; IEEE.

Osada, Kenichi et al.; "Universal-Vdd 0.65-2.0-V 32-kB Cache Using a Voltage-Adapted Timing-Generation Scheme and a Lithographically Symmetrical Cell"; IEEE Journal of Solid-State Ciruits; Nov. 2001: pp. 1738-1744; vol. 36, No. 11; IEEE.

\* cited by examiner

*Primary Examiner*—David Lam
(74) *Attorney, Agent, or Firm*—Robert L. King; James L. Clingan, Jr.

(57) ABSTRACT

A memory has an array of memory cells, a word line driver, a sense amplifier, and a sense enable circuit. Each memory cell has a coupling transistor for coupling a storage portion to a bit line. The coupling transistors have an average threshold voltage and a maximum threshold voltage. The word line driver is coupled to the array and is for enabling a selected row of memory cells in the array. The sense amplifier detects a state of a memory cell in the selected row in response to a sense enable signal. The sense enable circuit provides the sense enable signal at a time based on the maximum threshold voltage. This timing enables the sense amplifier sufficiently late for low temperature operation while providing for faster operation at high temperature than would normally be achieved using just the average threshold voltage in providing timing of the sense enable signal.

20 Claims, 3 Drawing Sheets

CIRCUIT AND METHOD FOR OPTIMIZING MEMORY SENSE AMPLIFIER TIMING

FIELD OF THE INVENTION

The present invention relates generally to semiconductor memories, and more particularly, to sense amplifiers for sensing voltages in semiconductor memories.

BACKGROUND OF THE INVENTION

It is well known that high performance semiconductor integrated circuits are migrating to power supply voltages that are less than one volt. With the migration to lower power supply voltage values, any transistor threshold voltage variations among a circuit's transistors will have a significant impact on the speed and power specification of the circuit. Similarly, fluctuations in the power supply voltage will also negatively affect speed and performance. Within an SRAM (static random access memory) circuit, replica memory cells and bit lines are used to create a reference signal whose delay tracks that of the functioning memory cells and bit lines of the SRAM. The reference signal is used to generate an enable signal for a sense amplifier that controls the timing of when the sense amplifier functions to sense a bit value of a given memory cell. Whether one replica memory cell or a plurality of replica memory cells are used, such replica memory cells are typically implemented with the slowest or worst-case memory cell parameters to ensure that adequate time is provided before a sense amplifier begins sensing. While this design criteria ensures functional operation of the memory, the design criteria also ensures that the sense amplifier will continually operate at a speed of the worst-case operating parameters.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
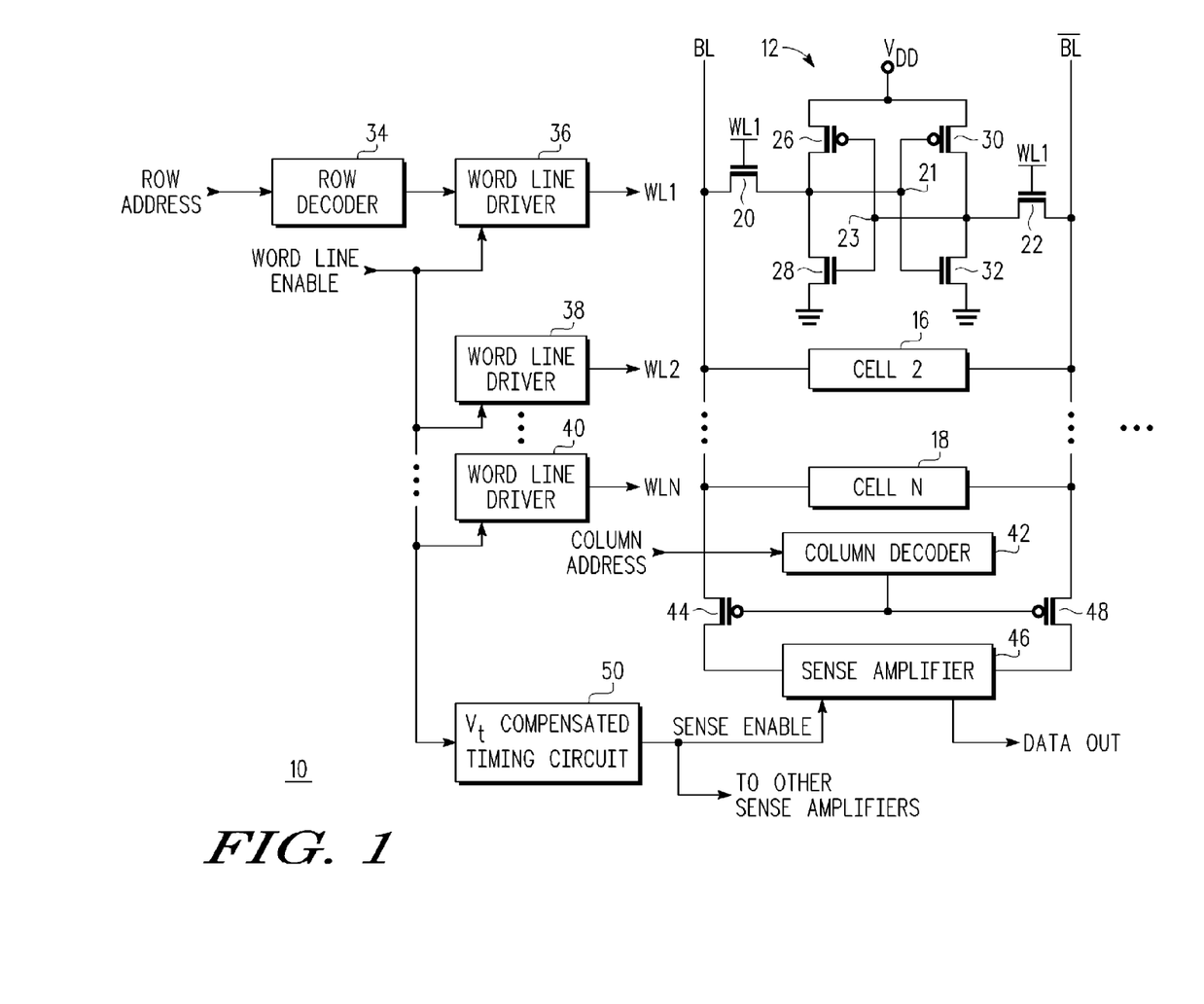
FIG. 1 illustrates in partial schematic form a static random access memory having a sense amplifier with timing control in accordance with one form of the present invention.

Illustrated in FIG. 1 is a memory 10. In one form memory 10 is implemented as a static random access memory (SRAM). It should be appreciated that other types of memory may be instantiated. Memory 10 is implemented with optimized sense amplifier timing. The static random access memory 10 has a plurality of memory cells such as a memory cell 12, a second memory cell 16 and an Nth memory cell 18, where N is an integer. The memory cell 12, second memory cell 16 and Nth memory cell 18 are positioned in a column and connected to a bit line, BL, and a complementary bit line. A pass transistor has a drain connected to the bit line, a gate for receiving a first word line signal, WL1, and a source connected to a node 21. An N-channel pass gate or coupling transistor 20 has a drain connected to the bit line, BL, a gate connected to the first word line signal, WL1, and a source connected to node 21. The coupling transistor 20 is a pass gate transistor for coupling a storage portion of the memory cell 12 to the bit line. An N-channel coupling transistor 22 has a drain connected to the complementary bit line, a gate for receiving the first word line signal, WL1, and a source connected to a node 23. A P-channel transistor 26 has a source connected to a power supply voltage terminal for receiving a supply voltage labeled $V_{DD}$. A gate of transistor 26 is connected to the node 23, and a drain of transistor 26 is connected to the node 21. A P-channel transistor 30 has a source connected to the $V_{DD}$ power supply voltage terminal, a gate connected to the node 21, and a drain connected to the node 23. An N-channel transistor 28 has a drain connected to the drain of transistor 26, a gate connected to node 23, and a source connected to a ground reference terminal. An N-channel transistor 32 has a drain connected to node 23, a gate connected to node 21, and a source connected to the ground reference terminal. Each of memory cell 16 and memory cell 18 is connected between the bit line BL and the complementary bit line. A row address is coupled to an input of a row decoder 34. An output of row decoder 34 is connected to an input of a word line driver 36. An output of word line driver 36 provides the word line signal WL1. A word line driver 38 provides a word line signal WL2 for use by memory cell 16. A word line driver 40 provides a word line signal WLN for use by memory cell 18. Each of word line driver 36, word line driver 38 and word line driver 40 have an enable input for receiving a word line enable signal. A threshold voltage ($V_t$) compensated timing circuit 50 has an enable input for receiving a word line enable signal. An output of the $V_t$ compensated timing circuit 50 provides a sense enable signal that is connected to an enable input of a sense amplifier 46. The sense enable signal may also be connected to additional sense amplifiers (not shown) associated with other columns of memory cells. A column decoder 42 has an input for receiving a column address. An output of column decoder 42 provides a column decode signal that is connected to a gate of a P-channel pass gate transistor 44 and to a gate of a P-channel pass gate transistor 48. A source of pass gate transistor 44 is connected to the bit line, BL, and a drain of pass gate transistor 44 is connected to a first data input of sense amplifier 46. A source of pass gate transistor 48 is connected to the complementary bit line, and a drain of pass gate transistor 48 is connected to a second data input of sense amplifier 46. Sense amplifier 46 has a data output terminal for providing a Data Out signal.

In operation, memory 10 receives a row address and decodes the row address to provide a partially decoded address to the word line driver 36. The word line driver 36 completes the address decoding and asserts the word line signal WL1 that is applied to the gates of coupling transistors 20 and 22. In one form other row decoders (not shown) are coupled to each of word line driver 38, word line driver 40 and other intervening word line drivers (not shown). When an asserted row address is presented to one of the word line drivers, a respective word line signal is asserted if the Word Line enable signal is also asserted. For example, the word line driver 36 asserts word line 1 signal, WL1, which is applied to the gate of coupling transistors 20 and 22. Only one word line is typically asserted within memory 10 at any point in time. Similarly, the word line 2 signal, WL2, is applied to the gate of pass gates (not shown) within the second memory cell 16.

The word line N signal, WLN, is applied to the gate of pass gates (not shown) within the third memory cell 18.

As the row address is being decoded, a column address is also being presented to the column decoder 42 and is decoded in parallel with the row address. The bit line, BL, and complementary bit line are coupled to pre-charge circuitry (not shown) and both bit lines are pre-charged to high voltage value prior to the column decoding. If the column decoder 42 addresses the column that memory cells 12, 16 and 18 form, then the column decoder 42 provides a low voltage to make pass gate transistors 44 and 48 conductive. Therefore, both the bit line and the complementary bit line are coupled to the sense amplifier 46. Within the memory cell 12 the nodes 21 and 23 are complementary storage nodes. Initially one assumes a logic high value and the other assumes a logic low value depending upon what data was previously written to the memory cell 12 in a conventional way. Once coupling transistors 20 and 22 become conductive, the transistor which is directly connected to whichever of nodes 21 and 23 that is storing a low level will cause the connected bit line to start transitioning low. For example, if node 21 stores a logic low level, when WL1 makes coupling transistor 20 conductive the bit line BL will start to transition to a logic low.

The sense amplifier 46 and possibly others (not shown) are enabled in response to a sense enable signal that is provided by the threshold voltage ($V_t$) compensated timing circuit 50. The threshold voltage compensated timing circuit 50 is enabled by the word line enable signal. The threshold voltage compensated timing circuit 50 is a sense enable circuit and functions to assert the sense enable signal in a controlled manner once the word line enable signal is asserted such that a minimum differential voltage is assured of being presented to the inputs of the sense amplifier 46. This minimum differential voltage is required to ensure that the sense amplifier 46 is able to accurately sense the data state of the addressed memory cell 12. This minimum differential voltage must be assured because the sense amplifier 46 operates with transistors having a certain amount of statistical variation in electrical parameters including threshold voltage. The timing circuit 50 or sense enable circuit will track the worst case memory cell current across all temperature variations within a predetermined specification range. For example, for low power applications having a $V_{DD}$ of less than one volt, the worst case memory cell current may have a value in the range of ten to fifteen microamperes at a temperature in the high portion of the operating temperature range. For a temperature in the low portion of the operating temperature range, the worst case memory cell current may be in the range of five to ten microamperes. Thus the bit cell current is much higher during high temperature operation than during low temperature operation for the worst case bit cell. This is a different behavior than a nominal device that may display more uniform current across the temperature range or that even shows degradation at high temperature. Therefore, this variation results in a non-optimal timing because at high temperature the delay provided to the sense amplifier does not need to be nearly as long as the delay at low temperature for the worst-case memory cell.

Figure 2:
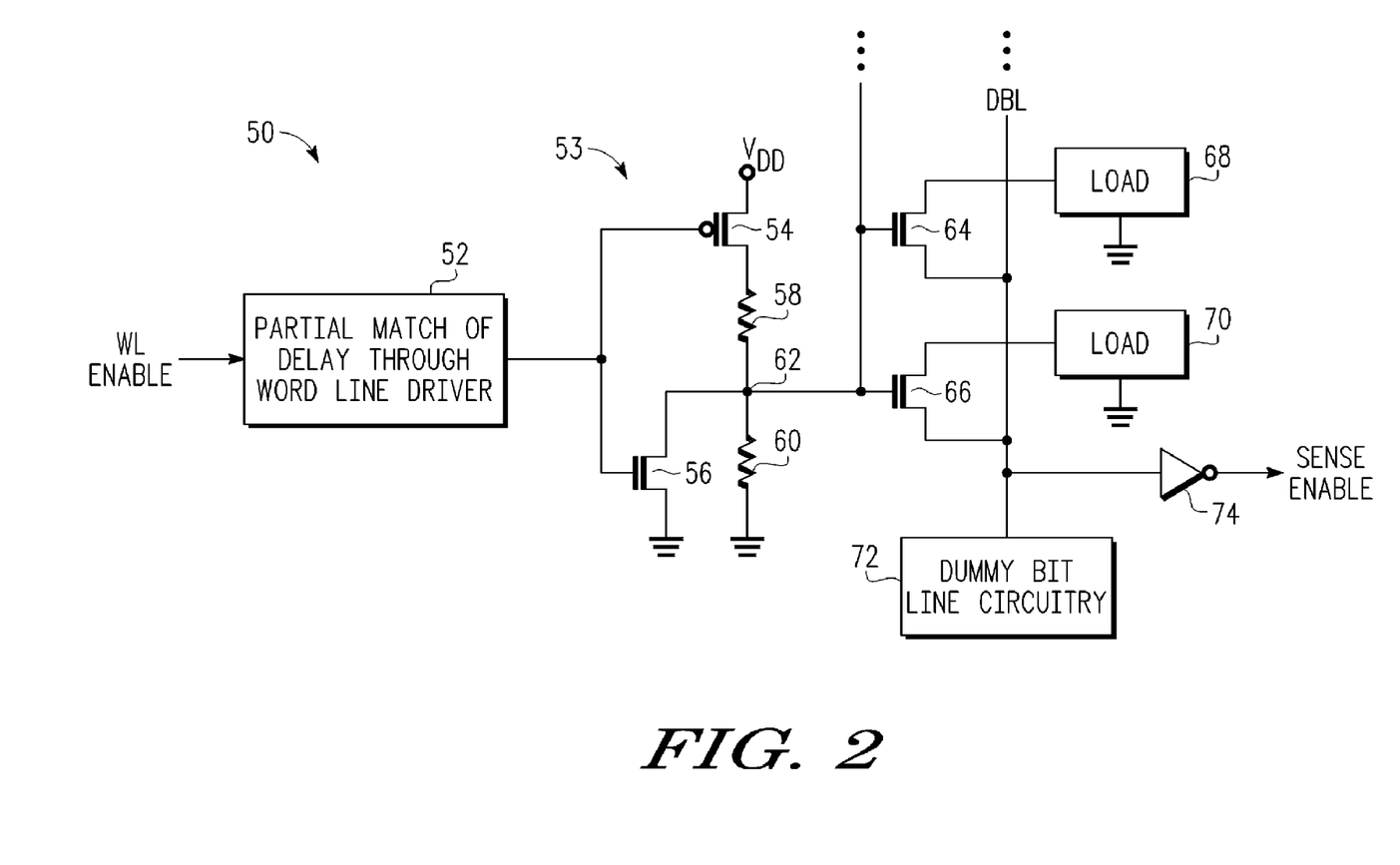
FIG. 2 illustrates in partial schematic form a transistor threshold voltage compensating circuit in accordance with one form of the present invention.

Illustrated in FIG. 2 is one form of several for the $V_t$ compensated timing circuit 50 of FIG. 1. In particular, the word line enable signal, WL Enable, is connected to an input of circuitry 52 that implements a partial match of the delay through any of the word line drivers of FIG. 1 such as word line driver 36. An output of the circuitry 52 is connected to a gate of a P-channel or P-conductivity transistor 54 and to a gate of an N-channel or N-conductivity transistor 56. A source of transistor 54 is connected to a terminal for receiving the $V_{DD}$ power supply voltage. A drain of transistor 54 is connected to a first terminal of a resistor 58. A second terminal of resistor 58 is connected to a first terminal of a resistor 60 at a node 62. A second terminal of resistor 60 is connected to a ground reference terminal. A drain of transistor 56 is connected to node 62, and a source of transistor 56 is connected to the ground reference terminal. An N-channel transistor 64 has a source connected to a first terminal of a load 68. A second terminal of load 68 is connected to the reference ground terminal. A gate of transistor 64 is connected to node 62. An N-channel transistor 66 has a source connected to a first terminal of a load 70. A second terminal of load 70 is connected to the reference ground terminal. A gate of transistor 66 is connected to the node 62. A drain of transistor 64 and a drain of transistor 66 are connected together and to a dummy bit line, DBL. The dummy bit line is connected to dummy bit line circuitry 72 and to an input of an inverter 74. An output of inverter 74 provides the sense enable signal illustrated in FIG. 1. Node 62 is illustrated as being extended in FIG. 2 wherein additional transistors (not shown), analogous to transistors 64 and 66 may be connected to node 62. Additionally, the dummy bit line, DBL, may be extended and connected to other transistors (not shown).

In operation, assume that the worst case memory cell for having the highest threshold voltage is memory cell 12. The worst case memory cell in one form is identified by an electrical test of the memory 10. The high threshold voltage of the worst case memory cell means that the voltage difference between $V_{DD}$ and $V_t$ is the smallest of all the memory cells in a memory array. The small voltage difference of the worst case memory cell results in a large variation in the drain saturation current (Idsat) versus temperature curve for circuit 50 and the worst case memory cell such that Idsat is a strongly increasing function of temperature. The transistors 64, 66 and loads 68 and 70 together with resistors 58 and 60 are implemented and sized specifically to model the desired signal development that is driven by memory cell 12. As indicated by the dots of FIG. 2, there may also be additional devices that together with transistors 64 and 66, loads 68 and 70, and resistors 58 and 60 function to model the memory cell 12. This model is accomplished by matching the electrical properties of memory cell 12 with portions of the circuitry in FIG. 2. A dummy bit line, DBL, is provided to model the electrical properties of the bit line BL. Hence the name "dummy" is used as this bit line is used to model the electrical properties of a functioning bit line. The dummy bit line circuitry 72 models the capacitance associated with the specific bit line illustrated in FIG. 1. Therefore, the dummy bit line circuitry 72 performs a precharge function of the dummy bit line. The dummy bit line circuitry 72 also models the capacitance associated with the switching pass gate transistors 44 and 48. The loads 68 and 70 are implemented with any of a variety of circuit loads. In one form the load 68 may duplicate the N-channel pull-down transistor 28 of FIG. 1 and could include a duplication of other transistors of memory cell 12. The loads 68 and 70 do not have to be duplicate loads and may vary in electrical properties. In one form transistors 64 and 66 are implemented with the same type of devices as coupling transistors 20 and 22. Alternatively, transistors 64 and 66 may be implemented as different types of transistor devices. The word line enable signal is delayed by circuitry 52 that is implemented as a stage of logic gates that partially match or model the delay that is present through the word line driver 36 of FIG. 1. The circuitry 52 may, in one form, be considered a first delay circuit of the WL enable signal and the circuitry of transistors 64, 66 and loads 68, 70 may be considered to be a second delay circuit that models a memory cell and a bit line having an input coupled to the output of the voltage divider formed by resistors 58 and 60. The second delay circuit provides the sense enable circuit prior to being inverted and driven to a desired voltage value by inverter 74. The second delay circuit may be considered to be the dummy bit line, the loads 68 and 70 and an active device in the form of transistors 64 and 66. Each transistor of the active device therefore has a first current electrode (i.e. a drain of each of transistors 64 and 66) connected to the dummy bit line, a control electrode (i.e. a gate) connected to the output of the voltage divider (node 62), and a second current electrode (i.e. a source of each of transistors 64 and 66) connected to the load (either load 68 or load 70). The active device is sized to have a threshold voltage that is an average threshold voltage value of the coupling transistors, such as coupling transistor 20, in the array of memory 10. In another form the active device (transistors 64 and 66) is a plurality of transistors having a delay that matches the coupling transistors of the worst-case memory cell in the array. The loads (load 68 and load 70) are a plurality of individual devices which each model a storage portion of the worst-case memory cell. In other words, load 68 would model transistor 28 and load 70 would model transistor 26. In another form the second delay circuit has an active device such as transistor 66 and a load 70 that have a gate-to-source voltage adjusted by the voltage divider of resistors 58 and 60 to provide a model of a coupling transistor, such as coupling transistor 20, having the maximum possible threshold voltage of all coupling transistors in memory cells in the array.

The $V_t$ compensated timing circuit 50 functions to model the WL enable signal progression through the timing circuit 50 in a manner similar to the progression of the WL enable signal through word line driver 36.

It should be noted that the resistors 58 and 60 function as a voltage divider network and have a predetermined specific resistance ratio. In particular, the ratio is set to provide a lower $V_{GS}$ value to the transistors 64 and 66 where the value $V_{GS}$ is the difference in voltage between the gate voltage, $V_G$, and the source voltage, $V_S$.

The memory cells of the array have coupling transistors, such as coupling transistor 20, that couple a storage portion to a bit line. Within process variations and temperature variations, the coupling transistors collectively have an average threshold voltage (i.e. a statistical average) and there is at least one coupling transistor that has a maximum possible threshold voltage (i.e. largest value). The voltage divider is further characterized as providing a voltage at the output of the voltage divider at node 62 that is representative of a difference between the average threshold voltage and the maximum possible threshold voltage.

For example, when transistor 54 is conductive, the ratio of resistors 58 and 60 is established such that the gate voltage applied to the gates of both transistor 64 and transistor 66 is lower than $V_{DD}$. When transistor 56 is conductive, both transistors 64 and 66 are non-conductive. The amount of voltage that the gates of transistors 64 and 66 are lowered from $V_{DD}$ matches the increase in the threshold voltage ($V_t$) of the coupling transistor 20 which corresponds to the bit with the worst-case bit cell current relative to the threshold voltage of a coupling transistor which corresponds to a bit with an average bit cell current. Transistors 64 and 66 function as timing devices for the timing circuit 50. The value ($V_{GS}-V_t$), the gate voltage drive, of the transistors 64 and 66 matches the ($V_{GS}-V_t$) value of the worst-case bit cell. For example, for a worst case bit cell threshold voltage ($V_t$) value that is 250 millivolts higher than the average bit cell threshold voltage ($V_t$) value and a supply voltage $V_{DD}$ of 1.0 volt, the resistance ratio (the resistance of resistor 60 divided by the sum of the resistance of resistors 58 and 60) is a ratio of approximately seventy-five percent. Timing circuit 50 therefore is functioning to generate an amount of delay before asserting the sense enable signal in response to the word line enable signal. This delay is optimized by the $V_{GS}$ control of the transistors controlling the timing function such that the delay is reduced at high temperature operation relative to the delay at low temperature. This occurs because the threshold voltage ($V_t$) of the transistors 64 and 66 at high temperature decreases relative to the threshold voltage ($V_t$) at cold temperature. By reducing the gate-to-source voltage ($V_{GS}$) when the threshold voltage ($V_t$) also is reduced, the amount of delay is dynamically and safely reduced by the timing circuit 50. The timing circuit 50 has an inverter 74. Inverter 74 inverts the logic state of the signal on the dummy bit line and provides an inversion thereof as the sense enable signal labeled "Sense Enable".

Figure 3:
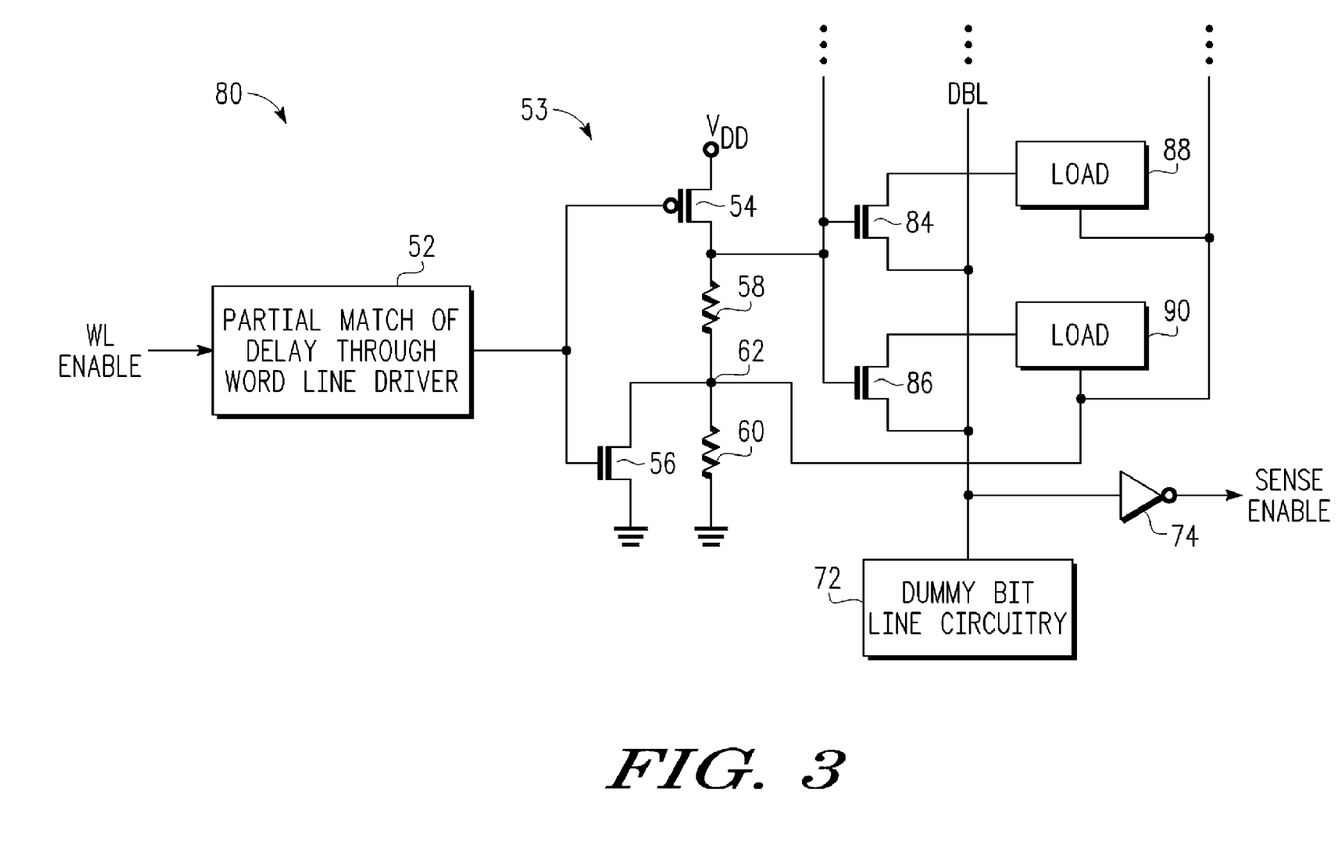
FIG. 3 illustrates in partial schematic form a transistor threshold voltage compensating circuit in accordance with another form of the present invention.

Illustrated in FIG. 3 is another form of the $V_t$ compensated timing circuit 50 of FIG. 1. For convenience of comparison, elements that are common with the form of the $V_t$ compensated timing circuit 50 of FIG. 1 are numbered the same. A $V_t$ compensated timing circuit 80 is illustrated in FIG. 3 having the circuitry 52 that is a partial match of delay through the word line driver of FIG. 1 such as word line driver 36. An input of circuitry 52 receives a WL enable signal. An output of circuitry 52 is connected to the gate of P-channel transistor 54 and the gate of N-channel transistor 56. A source of transistor 54 is connected to the $V_{DD}$ power supply. A drain of transistor 54 is connected to the gate of an N-channel transistor 84 and to the gate of an N-channel transistor 86. Other transistor gates (not shown) may be connected to the drain of transistor 54 as indicated by the dots of FIG. 3 if needed in order to more accurately model the electrical properties of a worst-case memory cell. However, additional transistor gates are not necessarily required. The drain of transistor 54 is also connected to a first terminal of resistor 58. A second terminal of resistor 58 is connected to a first terminal of resistor 60 at node 62. A second terminal of resistor 60 is connected to a ground reference terminal. A drain of transistor 56 is connected to node 62 and a source of transistor 56 is connected to the ground reference terminal. Node 62 is connected to a first terminal of each of a load 88 and a load 90. Additional loads may be connected to node 62 as indicated by the dots of FIG. 3 if needed for matching purposes with the worst case memory cell. Transistor 84 has a source connected to a second terminal of load 88. Transistor 86 has a source connected to a second terminal of load 90. A drain of each of transistors 84 and 86 is connected to a dummy bit line (DBL). Dummy bit line circuitry 72 is connected to the dummy bit line. Inverter 74 has an input connected to the dummy bit line and an output for providing the sense enable signal. Additionally, the dummy bit line, DBL, may be extended and connected to other transistors (not shown).

In operation, again assume that the worst case memory cell is memory cell 12. The transistors 84, 86 and loads 88 and 90 together with resistors 58 and 60 are implemented and sized specifically to model the desired signal development that is driven by memory cell 12. As indicated by the dots of FIG. 3, there may also be additional devices that together with transistors 84 and 86, loads 88 and 90, and resistors 58 and 60 function to model the memory cell 12. This model is accomplished by matching the electrical properties of memory cell 12 with portions of the circuitry in FIG. 3. As in FIG. 2, the dummy bit line, DBL, is provided to model the electrical properties of the bit line BL. The dummy bit line circuitry 72 models the capacitance associated with the specific bit line illustrated in FIG. 1. The dummy bit line circuitry 72 is again performing a pre-charge function of the dummy bit line. The dummy bit line circuitry 72 also models the capacitance associated with the switching pass gate transistors 44 and 48 of FIG. 1. The loads 88 and 90 may be implemented with any of a variety of circuit loads. In one form the load 88 may duplicate the N-channel pull-down transistor 28 of FIG. 1 and could include a duplication of other transistors of memory cell 12. The loads 88 and 90 do not have to be duplicate loads and may vary in electrical properties. Transistors 84 and 86 may be implemented with the same type of devices as coupling transistors 20 and 22 of FIG. 1. Alternatively, transistors 84 and 86 may be implemented as different types of transistor devices. The word line enable signal is delayed by circuitry 52 that is implemented as a stage of logic gates that partially match or model the delay that is present though the word line driver 36 of FIG. 1. The $V_t$ compensated timing circuit 50 functions to model the WL enable signal progression through the timing circuit 50 in a manner similar to the progression of the WL enable signal through word line driver 36.

Resistors 58 and 60 have a predetermined specific resistance ratio. In particular, the ratio is set to provide a lower $V_{GS}$ value to the transistors 84 and 86 where the value $V_{GS}$ is the difference in voltage between the gate voltage, $V_G$, and the source voltage, $V_S$. In this embodiment the lower $V_{GS}$ value is provided by selectively lowering the source voltage rather than selectively lowering the gate voltage prior to the assertion of the sense enable signal. When transistor 54 is conductive and transistor 56 non-conductive, the ratio of resistors 58 and 60 is established such that the voltage at node 62 is higher than the ground reference voltage. This lower voltage at node 62 is connected via the load 90 to the source of transistor 86. The load 90 can be considered to be a high impedance electrical connection to the source of transistor 86 that lowers the source voltage of transistor 86 further. When transistor 56 is conductive and transistor 54 non-conductive, both transistors 84 and 86 are non-conductive as the gate bias to these transistors has been removed. The amount of voltage that the sources of transistors 84 and 86 are increased above the ground reference voltage matches the increase in the threshold voltage ($V_t$) of the coupling transistor 20 which corresponds to the bit with the worst-case bit cell current. Transistors 84 and 86 therefore function as timing devices for the timing circuit 80. The value ($V_{GS}-V_t$) of the transistors 84 and 86 matches the ($V_{GS}-V_t$) value of the worst-case bit cell. For example, for a worst case bit cell threshold voltage ($V_t$) value that is 250 millivolts higher than the average bit cell threshold voltage ($V_t$) value and a supply voltage $V_{DD}$ of 1.0 volt, the resistance ratio (the resistance of resistor 60 divided by the sum of the resistance of resistors 58 and 60) is a ratio of approximately twenty-five percent. Timing circuit 80 therefore is functioning to generate an amount of delay before asserting the sense enable signal in response to the word line enable signal. This delay is optimized by the $V_{GS}$ control of the transistors controlling the timing function such that the delay is reduced at high temperature operation relative to the delay at low temperature. This delay occurs because the threshold voltage ($V_t$) of the transistors 84 and 86 at high temperature decreases relative to the threshold voltage ($V_t$) at cold temperature. By reducing the gate-to-source voltage ($V_{GS}$) when the threshold voltage ($V_t$) also is reduced, the amount of delay is dynamically and safely reduced by the timing circuit 80. The timing circuit 80 also uses inverter 74 to invert the logic state of the signal on the dummy bit line and provides an inversion thereof as the sense enable signal.

By now it should be appreciated that there has been provided a memory that reduces the gate-to-source voltage of a sense amplifier timing device transistor by either reducing the gate voltage or by increasing the source voltage applied to the timing device transistor. The delay of the timing device matches a worst-case memory cell timing that is due to a memory bit that has a coupling transistor or pass gate transistor with the highest threshold voltage. In one form the difference between the gate voltage and the $V_t$ of a timing device in a timing circuit matches the difference between the gate voltage and the $V_t$ of the worst-case pass gate transistor in a memory array. The delay of the sense enable signal generated by the timing circuits 50 and 80 tracks with the performance of the bit cells connected to the sense amplifier across a wide range of temperatures. The ratio of resistors 58 and 60 is set so that a fairly constant bitcell differential voltage is provided to the sense amplifier for the worst-case bit cell across a wide temperature range. The method described herein advantageously permits a user to not lose sense amplifier performance time for other bit cells that have a lower pass gate transistor threshold voltage than the worst case pass gate transistor. In conventional techniques a timing device was used that specified all sense amplifier operation enable signal delay for the worst-case bit cell at the most detrimental temperature performance. Therefore, when reading the worst-case memory cell at temperatures that result in the generation of a larger voltage differential, an unnecessary delay existed before the sense amplifier was enabled. In the method and circuitry described herein, a method and circuit is provided as the $V_{GS}$ of the timing device is modified, and thus the sense amplifier enable timing is dynamically modified as a function of temperature.

In one form there is herein provided a memory having an array of memory cells. Each memory cell has a coupling transistor for coupling a storage portion to a bit line. All coupling transistors collectively have an average threshold voltage and at least one coupling transistor has a maximum possible threshold voltage. The average threshold voltage is a statistical average of the threshold voltages of the coupling transistors of the array of memory cells. A word line driver is coupled to the array for enabling a selected row of memory cells in the array. A sense amplifier detects a state of a memory cell in the selected row in response to a sense enable signal. A sense enable circuit provides the sense enable signal at a time based on the maximum possible threshold voltage. In one form the sense enable circuit is a voltage divider of a power supply voltage that provides an output based on a difference between the average threshold voltage and the maximum possible threshold voltage. In another form the sense enable circuit has a first delay circuit that provides a partial match of delay through the word line driver and a second delay circuit having a bit line portion based on the bit line and on precharge circuitry and a delay configuration that models the average threshold voltage which is a statistical average of the threshold voltages of the coupling transistors in the memory cells of the memory array. A third delay circuit provides an input to the delay configuration causing the delay configuration to respond as modeling the maximum possible threshold voltage. In another form the voltage divider has a first terminal and a second terminal and has a first resistor and a second resistor. The first resistor has a first terminal as the first terminal of the voltage divider and a second terminal. The second resistor has a first terminal coupled to the second terminal of the first resistor and a second terminal as the second terminal of the voltage divider. The second terminal of the first resistor and the first terminal of the second resistor form an output of the voltage divider. In another form the third delay circuit has a first transistor having a first current electrode coupled to a first power supply terminal, a control electrode coupled to the first delay circuit, and a second current electrode coupled to a first terminal of the voltage divider. The output of the resistor divider is coupled to the delay configuration of the second delay circuit. In another form the second delay circuit has a second transistor having a control electrode coupled to the output of the resistor divider, a first current electrode coupled to the bit line portion, and a second current electrode. A load has a first terminal coupled to the second current electrode of the second transistor and a second terminal coupled to a second power supply terminal. In another form the load models a portion of the storage portion. In yet another form the third delay circuit further has a third transistor having a first current electrode coupled to the output of the voltage divider, a control electrode coupled to the control electrode of the first transistor, and a second current electrode coupled to the second power supply terminal. The third transistor is N-type conductivity and the first transistor is P-type conductivity. In another form the second delay circuit has a second transistor having a control electrode coupled to the second current electrode of the first transistor, a first current electrode coupled to the bit line portion, and a second current electrode. A load has a first terminal coupled to the second current electrode of the second transistor and a second terminal coupled to the output of the voltage divider. In yet another form the third delay circuit further has a third transistor having a first current electrode coupled to the output of the voltage divider, a control electrode coupled to the control electrode of the first transistor, and a second current electrode coupled to the second power supply terminal, wherein the third transistor is N-type conductivity and the first transistor is P-type conductivity. In yet another form the sense enable circuit and the word line driver are responsive to a word line enable signal.

There is also provided herein a memory having an array of memory cells. A word line driver is coupled to the array for enabling a selected row of memory cells in the array. A sense amplifier detects a state of a memory cell in the selected row in response to a sense enable signal. A sense enable circuit provides the sense enable signal at a time based on a maximum possible threshold voltage of predetermined transistors in the array of memory cells. The sense enable circuit has a first resistor having a first terminal as a first terminal of the voltage divider and a second terminal. A second resistor has a first terminal coupled to the second terminal of the first resistor and a second terminal as a second terminal of a voltage divider formed by the first and the second resistor. The second terminal of the first resistor and the first terminal of the second resistor form an output of the voltage divider. A first delay circuit has an input responsive to a word line enable signal and an output. A first transistor has a first current electrode coupled to a first power supply terminal, a control electrode coupled to the output of the first delay circuit, and a second current electrode coupled to the first terminal of the voltage divider. A second delay circuit is characterized as modeling a bit line and a memory cell having an input coupled to the output of the voltage divider and an output that provides the sense enable signal. The memory cells of the array have coupling transistors that couple a storage portion to a bit line, wherein the coupling transistors have an average threshold voltage and have a maximum possible threshold voltage. The voltage divider is further characterized as providing a voltage at the output of the voltage divider representative of a difference between the average threshold voltage and the maximum possible threshold voltage. In one form the difference between the voltage at the output of the voltage divider and the $V_{DD}$ supply voltage at the first power supply terminal is equal to the difference between the average threshold voltage and the maximum possible threshold voltage. In another form the second delay circuit has a dummy bit line, a load, and a second transistor having a first current electrode coupled to the dummy bit line, a control electrode coupled to the output of the voltage divider, and a second current electrode coupled to the load. In yet another form the second delay circuit is a dummy bit line, a load, and an active device having a first current electrode coupled to the dummy bit line, a control electrode coupled to the output of the voltage divider, and a second current electrode coupled to the load, wherein the active device closely approximates the average threshold voltage. The term "closely approximates" means that the threshold voltage of the active device is close to the value of the average threshold voltage (i.e. within five percent of the value) as realistically a device is not likely to be made that has a threshold voltage value that is exactly the average threshold voltage value. In another form the active device has a plurality of transistors matching the coupling transistors and the load has a plurality of individual devices each modeling a storage portion of the memory cells. In another form the second delay circuit has a dummy bit line, a load having a first terminal coupled to the output of the voltage divider and a second terminal, and an active device having a first current electrode coupled to the dummy bit line, a control electrode coupled to the second current electrode of the first transistor, and a second current electrode coupled to a second terminal of the load. In yet another form the second delay circuit has an active device and a load that have a gate-to-source voltage adjusted by the voltage divider to provide a model of a coupling transistor having the maximum possible threshold voltage.

In yet another form there is provided a method of enabling a sense amplifier of a memory having an array of memory cells. An average threshold voltage of coupling transistors that couple a storage portion of the memory cells to a bit line is obtained. A maximum possible threshold voltage of the coupling transistors is obtained. The sense amplifier is enabled in response to a sense enable signal. A device is provided that models the average threshold voltage. A reference voltage is generated at node 62 wherein the reference voltage is representative of a difference between the maximum possible threshold voltage and the average threshold voltage. A word line enable signal is delayed to produce an output enable signal by applying the reference voltage to the device. The output enable signal enables the sense amplifier. In another form providing the device is implemented by providing a plurality of transistors and loads. Generating the reference voltage is implemented in one form by providing a voltage divider that provides an output at a voltage below a power supply voltage by an amount that is equal to a difference between the average threshold voltage and the maximum possible threshold voltage.

Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. Unless expressly indicated otherwise, terms such as "first" and "second" are used to arbitrarily distinguish between the elements such terms describe. Thus, these terms are not necessarily intended to indicate temporal or other prioritization of such elements. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. It should be understood that all circuitry described herein may be implemented either in silicon or another semiconductor material or alternatively by software code representation of silicon or another semiconductor material.

What is claimed is:

1. A memory comprising:
    an array of memory cells, wherein each memory cell comprises a coupling transistor for coupling a storage portion to a bit line, wherein a statistical average of threshold voltages of coupling transistors within the array is an average threshold voltage and at least one coupling transistor has a maximum possible threshold voltage;
    a word line driver coupled to the array for enabling a selected row of memory cells in the array;
    a sense amplifier for detecting a state of a memory cell in the selected row in response to a sense enable signal; and
    a sense enable circuit for providing the sense enable signal at a time based on the maximum possible threshold voltage.

2. The memory of claim 1, wherein the sense enable circuit comprises a voltage divider of a power supply voltage that provides an output based on a difference between the average threshold voltage and the maximum possible threshold voltage.

3. The memory of claim 2, wherein the sense enable circuit comprises:
    a first delay circuit that provides a partial match of delay through the word line driver;
    a second delay circuit comprising a bit line portion based on the bit line and on precharge circuitry and a delay configuration that models the average threshold voltage; and
    a third delay circuit providing an input to the delay configuration causing the delay configuration to respond as modeling the maximum possible threshold voltage.

4. The memory of claim 3, wherein the voltage divider has a first terminal and a second terminal and comprises:
    a first resistor having a first terminal as the first terminal of the voltage divider and a second terminal; and
    a second resistor having a first terminal coupled to the second terminal of the first resistor and a second terminal as the second terminal of the voltage divider, wherein the second terminal of the first resistor and the first terminal of the second resistor form an output of the voltage divider.

5. The memory of claim 4, wherein the third delay circuit comprises:
    a first transistor having a first current electrode coupled to a first power supply terminal, a control electrode coupled to the first delay circuit, and a second current electrode coupled to a first terminal of the voltage divider;
    wherein:
    the output of the voltage divider is coupled to the delay configuration of the second delay circuit.

6. The memory of claim 5, wherein the second delay circuit comprises:
    a second transistor having a control electrode coupled to the output of the voltage divider, a first current electrode coupled to the bit line portion, and a second current electrode; and
    a load having a first terminal coupled to the second current electrode of the second transistor and a second terminal coupled to a second power supply terminal.

7. The memory of claim 6, wherein the load models a portion of the storage portion.

8. The memory of claim 6, wherein the third delay circuit further comprises a third transistor having a first current electrode coupled to the output of the voltage divider, a control electrode coupled to the control electrode of the first transistor, and a second current electrode coupled to the second power supply terminal, wherein the third transistor is N type and the first transistor is P type.

9. The memory of claim 5, wherein the second delay circuit comprises:
    a second transistor having a control electrode coupled to the second current electrode of the first transistor, a first current electrode coupled to the bit line portion, and a second current electrode; and
    a load having a first terminal coupled to the second current electrode of the second transistor and a second terminal coupled to the output of the voltage divider.

10. The memory of claim 9, wherein the third delay circuit further comprises a third transistor having a first current electrode coupled to the output of the voltage divider, a control electrode coupled to the control electrode of the first transistor, and a second current electrode coupled to a second power supply terminal, wherein the third transistor is N-conductivity type and the first transistor is P-conductivity type.

11. The memory of claim 1, wherein the sense enable circuit and the word line driver are responsive to a word line enable signal.

12. A memory comprising:
    an array of memory cells:
    a word line driver coupled to the array for enabling a selected row of memory cells in the array;
    a sense amplifier for detecting a state of a memory cell in the selected row in response to a sense enable signal; and
    a sense enable circuit for providing the sense enable signal at a time based on a maximum possible threshold voltage of predetermined transistors in the array of memory cells, wherein the sense enable circuit comprises:
    a first resistor having a first terminal as a first terminal of a voltage divider and a second terminal;
    a second resistor having a first terminal coupled to the second terminal of the first resistor and a second terminal as a second terminal of the voltage divider comprising the first resistor and the second resistor, wherein the second terminal of the first resistor and the first terminal of the second resistor form an output of the voltage divider;
    a first delay circuit having an input responsive to a word line enable signal and an output;
    a first transistor having a first current electrode coupled to a first power supply terminal, a control electrode coupled to the output of the first delay circuit, and a second current electrode coupled to the first terminal of the voltage divider; and
    a second delay circuit characterized as modeling a bit line and a memory cell having an input coupled to the output of the voltage divider and an output that provides the sense enable signal.

13. The memory of claim 12, wherein the memory cells of the array are characterized by having coupling transistors that couple a storage portion to a bit line, wherein the coupling transistors collectively have an average threshold voltage and at least one has a maximum possible threshold voltage, wherein the voltage divider is further characterized as providing a voltage at the output of the voltage divider representative of a difference between the average threshold voltage and the maximum possible threshold voltage.

14. The memory of claim 13, wherein a difference between a reference voltage and a supply voltage at the first power supply terminal is equal to the difference between the average threshold voltage and the maximum possible threshold voltage.

15. The memory of claim 13, wherein the second delay circuit comprises:
   a dummy bit line;
   a load; and
   a second transistor having a first current electrode coupled to the dummy bit line, a control electrode coupled to the output of the voltage divider, and a second current electrode coupled to the load.

16. The memory of claim 13, wherein the second delay circuit comprises:
   a dummy bit line;
   a load; and
   an active device having a first current electrode coupled to the dummy bit line, a control electrode coupled to the output of the voltage divider, and a second current electrode coupled to the load, wherein the active device closely approximates the average threshold voltage.

17. The memory of claim 16 wherein the active device comprises a plurality of transistors matching electrical parameters of the coupling transistors, and the load comprises a plurality of individual devices each modeling a storage portion of the memory cells.

18. The memory of claim 13, wherein the second delay circuit comprises:
   a dummy bit line;
   a load having a first terminal coupled to the output of the voltage divider and a second terminal; and
   an active device having a first current electrode coupled to the dummy bit line, a control electrode coupled to the second current electrode of the first transistor, and a second current electrode coupled to a second terminal of the load.

19. The memory of claim 13, wherein the second delay circuit comprises an active device and a load that have a gate-to-source voltage adjusted by the voltage divider to provide a model of a coupling transistor having a maximum possible threshold voltage.

20. A method of enabling a sense amplifier of a memory having an array of memory cells, comprising:
   obtaining an average threshold voltage of coupling transistors that couple a storage portion of the memory cells to a bit line;
   obtaining a maximum possible threshold voltage of the coupling transistors;
   enabling the sense amplifier in response to a sense enable signal;
   providing a device as modeling the average threshold voltage;
   generating a reference voltage, wherein the reference voltage is representative of a difference between the maximum possible threshold voltage and the average threshold voltage; and
   delaying a word line enable signal to produce an output enable signal by applying the reference voltage to the device, the output enable signal enabling the sense amplifier.

* * * * *